(12) United States Patent
Schoen et al.

(10) Patent No.: US 9,083,308 B2
(45) Date of Patent: *Jul. 14, 2015

(54) MEMS DEVICE

(75) Inventors: Florian Schoen, Munich (DE); Mohsin Nawaz, Unterhaching (DE); Mihail Sararoiu, Bucharest (RO)

(73) Assignee: Infineon Technologies AG, Neubiberg AG (DE)

( * ) Notice: Subject to any disclaimer, the term of this patent is extended or adjusted under 35 U.S.C. 154(b) by 258 days.

This patent is subject to a terminal disclaimer.

(21) Appl. No.: 13/349,197

(22) Filed: Jan. 12, 2012

(65) Prior Publication Data

US 2012/0105173 A1    May 3, 2012

Related U.S. Application Data

(63) Continuation of application No. 12/474,368, filed on May 29, 2009, now Pat. No. 8,115,573.

(51) Int. Cl.
*H03H 9/24* (2006.01)
*H03H 9/46* (2006.01)
*H03H 9/02* (2006.01)

(52) U.S. Cl.
CPC ......... *H03H 9/2431* (2013.01); *H03H 9/02409* (2013.01); *H03H 9/02417* (2013.01); *H03H 9/2463* (2013.01); *H03J 2200/19* (2013.01)

(58) Field of Classification Search
CPC .......... H03H 9/02409; H03H 9/02417; H03H 9/02259; H03H 9/02425; H03H 9/2431; H03H 9/2463; H03H 2007/008; H03H 2009/02259; H03H 2009/02291; H03H 2009/02503; H03H 2009/02346; H03J 2200/19

USPC ................... 333/186–188, 197–200; 310/309
See application file for complete search history.

(56) References Cited

U.S. PATENT DOCUMENTS

| | | | | |
|---|---|---|---|---|
| 3,614,678 A | * | 10/1971 | Engeler et al. | 333/187 |
| 5,090,254 A | * | 2/1992 | Guckel et al. | 73/862.59 |
| 5,275,055 A | * | 1/1994 | Zook et al. | 73/778 |
| 5,550,516 A | * | 8/1996 | Burns et al. | 331/65 |
| 5,852,242 A | | 12/1998 | Devolk et al. | 73/514.17 |
| 5,914,553 A | | 6/1999 | Adams et al. | 310/309 |
| 6,621,134 B1 | * | 9/2003 | Zurn | 257/415 |
| 6,642,067 B2 | | 11/2003 | Dwyer | 438/17 |
| 6,717,488 B2 | * | 4/2004 | Potter | 333/186 |

(Continued)

FOREIGN PATENT DOCUMENTS

WO    WO 2008/001979    1/2008

OTHER PUBLICATIONS

W-L. Huang et al.; "UHF Nickel Micromechanical Spoke-Supported Ring Resonators"; Transducers & Eurosensors '07, The 14th International Conference on Solid-State Sensors, Actuators and Microsystems, Lyon, France, Jun. 10-14, 2007, pp. 323-326.*

(Continued)

*Primary Examiner* — Barbara Summons
(74) *Attorney, Agent, or Firm* — Slater & Matsil, L.L.P.

(57) ABSTRACT

System and method for a microelectromechanical system (MEMS) is disclosed. A preferred embodiment comprises a first anchor region, a vibrating MEMS structure fixed to the first anchor region, a first electrode adjacent the vibrating MEMS structure, a second electrode adjacent the vibrating MEMS structure wherein the vibrating MEMS structure is arranged between the first and the second electrode.

19 Claims, 2 Drawing Sheets

(56) References Cited

U.S. PATENT DOCUMENTS

| | | | |
|---|---|---|---|
| 6,894,586 B2 | 5/2005 | Bircumshaw et al. | 333/133 |
| 6,909,221 B2* | 6/2005 | Ayazi et al. | 310/321 |
| 6,958,566 B2* | 10/2005 | Nguyen et al. | 310/321 |
| 6,985,051 B2 | 1/2006 | Nguyen et al. | 333/186 |
| 7,215,061 B2 | 5/2007 | Kihara et al. | 310/309 |
| 7,221,241 B2 | 5/2007 | Lutz et al. | 333/186 |
| 7,295,088 B2 | 11/2007 | Nguyen et al. | 333/136 |
| 7,323,952 B2* | 1/2008 | Pan et al. | 333/186 |
| 7,348,867 B2* | 3/2008 | Hattori | 333/186 |
| 7,639,104 B1 | 12/2009 | Quevy et al. | 333/186 |
| 8,115,573 B2* | 2/2012 | Schoen et al. | 333/186 |
| 2002/0105393 A1* | 8/2002 | Clark et al. | 333/197 |
| 2005/0104675 A1 | 5/2005 | Brunson et al. | 331/103 C |
| 2005/0274183 A1 | 12/2005 | Shcheglov et al. | |
| 2006/0163679 A1* | 7/2006 | LaFond et al. | 257/414 |
| 2008/0224319 A1 | 9/2008 | Nakamura | 257/758 |
| 2009/0057792 A1 | 3/2009 | Steeneken et al. | |
| 2009/0322448 A1 | 12/2009 | Bhave et al. | 333/136 |
| 2010/0327992 A1 | 12/2010 | Suzuki | 333/186 |

OTHER PUBLICATIONS

Piazza et al.; "Voltage-Tunable Piezoelectrically-Transduced Single-Crystal Silicon Resonators on SOI Substrate"; 2003 IEEE The Sixteenth Annual International Conference on Micro Electro Mechanical Systems, MEMS-03 Kyoto, Jan. 19-23, 2003, pp. 149-152 and 1 page IEEE abstract.*

Ann, Y., et al., "Capacitive Microbeam Resonator Design," Journal of Micromechanics and Microengineering, Aug. 9, 2000, pp. 70-80, Institute of Physics Publishing, UK.

Lee, J., et al., "RF-MEMS Voltage Tunable Capacitor using Electrostatic Forces," Nanotech 2003, vol. 2, pp. 388-391, www.nsti.org.

Agarwal, M., et al., "Effects of Mechanical Vibrations and Bias Voltage Noise on Phase Noise of MEMS Resonator Based Oscillators," MEMS 2006, Jan. 22-26, 2006, pp. 154-157, IEEE.

Cheow, L.F., et al, "MEMS Filter with Voltage Tunable Center Frequency and Bandwidth," Solid-State Sensors, Actuators, and Microsystems Workshop, Jun. 4-8, 2006, pp. 304-307.

Hsu, W.T., et al., "Frequency Trimming for MEMS Resonator Oscillators," 2007, pp. 1088-1091, IEEE.

Kafumbe, S.M.M., et al., "Frequency adjustment of microelectromechanical cantilevers using electrostatic pull down," Journal of Micromechanics and Microengineering, Apr. 8, 2005, pp. 1033-1039, 2005 IOP Publishing Ltd., United Kingdom.

K.B. Lee et al.; "Frequency Tuning of a Laterally Driven Microresonator Using an Electrostatic Comb Array of Linearly Varied U Length"; Transducers '97, 1997 International Conference on Solid-State Sensors and Actuators, pp. 113-116, Chicago, Jun. 16-19, 1997.

B. Morgan et al.; "Vertically-Shaped Tunable MEMS Resonators"; Journal of Microelectromechanical Systems, vol. 17, No. 1, pp. 85-92, Feb. 2008.

* cited by examiner

MEMS DEVICE

This application is a continuation of U.S. patent application Ser. No. 12/474,368, entitled "MEMS Device," filed on May 29, 2009 and issued as U.S. Pat. No. 8,115,573 on Feb. 14, 2012 and is hereby incorporated herein by reference.

TECHNICAL FIELD

The present invention relates generally to a system and method of resonator devices, and more particularly to a system and method for microelectromechanical system (MEMS) resonator devices.

BACKGROUND

A resonator is a device that exhibits resonant behavior, that is, it oscillates at some frequencies with greater amplitude than at other frequencies. A resonator usually oscillates at specific frequencies because its properties and dimensions are an integral multiple of the wavelength at those frequencies. Resonators may be used to generate waves of specific frequencies or to select specific frequencies from a signal.

In some applications it is desirable to replace a quartz crystal with a microelectromechanical system (MEMS) resonator. For example, efforts have been made to introduce radio frequency (RF) MEMS devices for timing applications. Compared with quartz crystals, MEMS resonators can provide reduced size as well as improved integration with an oscillator or application specific integrated circuits (ASIC), thereby providing reduced overall system costs.

To meet application specifications, a MEMS resonator device often needs to have several characteristics at the same time. These characteristics can include high frequency stability, low supply voltage, low impedance supporting low power consumption, low phase noise and fast start up behavior. To achieve high compatibility for different applications, it is desired to have a variable resonator frequency that is scalable by design rather than by process change. The performance parameters of the resonators depend on the process concept, such as materials, process stability and to a large extent on the resonator design itself.

SUMMARY OF THE INVENTION

In accordance with a preferred embodiment of the present invention, a microelectromechanical system (MEMS) is disclosed. The MEMS includes a first anchor region, a vibrating MEMS structure fixed to the first anchor region, a first electrode adjacent the vibrating MEMS structure and a second electrode adjacent the vibrating MEMS structure. The vibrating MEMS structure is arranged between the first and the second electrode.

In accordance with another preferred embodiment of the present invention, a method for adjusting a resonance frequency of a microelectromechanical system (MEMS) is disclosed. The method includes providing a MEMS resonator comprising a resonator element, a first electrode and a second electrode, the resonator element being arranged between the first and the second electrode. The method further includes applying a first bias voltage to the resonator element and the first electrode and applying a second bias voltage to the second electrode, wherein the second bias voltage is independent from the first bias voltage.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
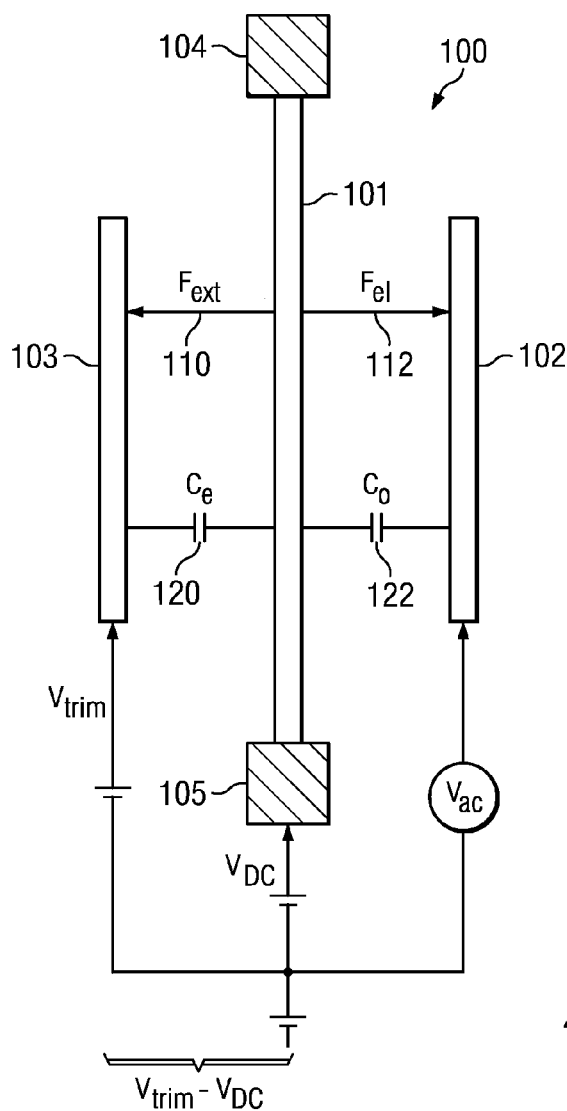
FIG. 1 is an embodiment of a MEMS resonator with two anchor regions.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in MEMS resonator devices. The invention may also be applied to yet other embodiments such as resonator devices. Other applications are also foreseen.

Accuracy is one of the major topics in MEMS technology. Small process deviations (e.g. lithography) can lead to a slightly changed mechanical behavior. For resonator applications of MEMS devices, the resonance frequency (f) is determined by the moving mass (m) and the stiffness (k) of its resonator:

$$f = \frac{1}{2\pi}\sqrt{\frac{k}{m}}$$

Small process variations can lead to either a slightly changed mass or a slightly changed stiffness or both. Therefore, the resonance frequency (f) will slightly change too:

$$f = \frac{1}{2\pi}\sqrt{\frac{k+\Delta k}{m+\Delta m}}$$

Conventional methods provide active or passive trimming techniques to adjust the resonance frequency (f) of a resonator device.

With passive trimming techniques the resonator devices are trimmed directly after wafer level test. Two techniques have been proposed: A deposition technique and a laser trimming technique. Both change the mass of the resonator and therefore the resonance frequency. A significant disadvantage of the deposition technique is that it can only be used with devices which are not sealed, i.e. where the device itself is directly accessible. In contrast, laser trimming is applicable to sealed resonators. However, laser trimming techniques require multiple test and run cycles which make production costly.

The most commonly used trimming techniques are active trimming techniques. One active trimming technique uses a phase locked loop (PLL). A PLL is an active system and contributes to noise which in turn has a negative influence on the noise performance of the resonator system.

Another active trimming technique is heating the resonator device. However, heating the device to alter the material properties requires significant power and is therefore not desirable.

Still, a further active trimming technique is bias voltage trimming which makes use of an effect called electrical spring softening. Electrical spring softening leads to a shift in resonance frequency by applying a bias voltage ($V_{Bias}$). The electrical spring softening ($k_{elec}$) depends on a bias voltage ($V_{Bias}$) applied between an electrode and a resonator. The electrical spring softening ($k_{elec}$) is further influenced by a gap distance (d) and an area (A) between both of them.

$$k_{elec} = -\frac{\varepsilon A}{d^3} V_{Bias}$$

The influence of the electrical spring softening on the resonance frequency (f) can be described as follows:

$$f = \frac{1}{2\pi} \sqrt{\frac{k + k_{elec}}{m}}$$

Performance parameters such as quality factor and motional resistance strongly depend on electro-mechanical coupling (η). The electro-mechanical coupling factor (η) itself depends from a capacitance (C) between the electrode and the resonator, a gap (d) between both and an applied bias voltage ($V_{Bias}$).

$$\eta = \frac{C}{d} V_{Bias}$$

Large values of the bias voltage ($V_{Bias}$) may substantially influence the other performance parameters. In order to avoid such a substantial impact on these parameters, the use of the bias voltage ($V_{Bias}$) to adjust the resonance frequency (f) may be limited to a trimming range of small values of several tens to some hundreds of parts per million (ppm). However, the electrical and quality performance of the resonator device may be insufficient with decreasing bias voltage ($V_{Bias}$), for example.

Further, as the resonance frequency (f) is bias voltage ($V_{Bias}$) dependent any amplitude noise of the bias supply may directly translate to phase noise within the resonator of the MEMS device. This may have a substantial impact on the output frequency of high level RF MEMS applications such as GSM, UMTS or WCDMA.

To provide more freedom in adjusting the resonance frequency (f) an additional electrical field is applied to the resonator device. The additional electrical field is introduced by an additional electrode, for example. Alternatively, the additional electrical field or the additional electrical fields may be introduced by a plurality of additional electrodes. The additional electrical field(s) or the additional electrode(s) will provide an additional degree of freedom in adjusting the resonator devices and more particular the resonance frequencies of MEMS resonators, for example. The additional electrical field(s) or the additional electrode(s) may only influence other performance parameters in a very limited way in other embodiments.

Therefore, an additional electrical stiffness ($k_{trim}$) can be added to the resonance frequency equation and the equation can be written as $$f = \frac{1}{2\pi} \sqrt{\frac{k + k_{elec} + k_{trim}}{m}}$$

Finally, embodiments of the inventive method may guarantee frequency tuning throughout the lifetime of the MEMS device.

Referring now to FIG. 1, a schematic view of a first embodiment of a MEMS device 100 is shown. The MEMS device 100 includes a vibrating structure or resonator element, typically a resonator electrode 101, a first electrode or drive electrode 102 and a second electrode or external electrode 103. In one embodiment, the MEMS device 100 is a clamped-clamped beam resonator (CC Beam) wherein the beam or the resonator electrode 101 is anchored to the substrate at the top 104 and the bottom 105.

The MEMS device 100 may be made of silicon wherein the moving part, i.e. the resonator electrode 101, may comprise polysilicon. Alternatively, the MEMS device 100 includes a mono-crystalline silicon layer such as a silicon on insulator (SOI) substrate. Such a resonator device 100 benefits from well-defined mono-crystalline material properties. MEMS device 100 may be based on materials other than pure silicon, for example, silicon germanium (SiGe).

Different designs can address different performance parameters. For example, vibrating structures or resonator elements such as beam structures operating in a flexural mode have a relatively small mechanical spring constant and can therefore achieve a low impedance at a low supply voltage. Other designs may operate in pure breath mode or bulk acoustic mode and may have larger mechanical spring constants compared to the flexural beam design.

One way of optimizing resonator device parameters, such as good phase noise, low impedance and low bias voltage, is to start with a bulk acoustic mode design and optimize it for low bias voltage and low impedance. Resonator gap width, mechanical spring constant, and resonator area can be varied to achieve these results.

In one embodiment a desired resonance frequency (f) may be set by applying a DC bias voltage ($V_{DC}$) across the resonator electrode 101 and the drive electrode 102. $V_{DC}$ is also responsible for electro-mechanical coupling (η) and, therefore, has an effect on other important parameters such as quality factor and motional resistance.

To further tune the frequency towards the desired resonance frequency (f) an additional trimming voltage ($V_{trim}$) may be applied to the external electrode 103. The DC potential difference between the resonator electrode 101 and the external electrode 103 is $V_{trim}$-$V_{DC}$. By varying only $V_{trim}$ the potential difference between the external electrode 103 and the resonator electrode 101 may vary, whereas the potential difference between the drive electrode 102 and the resonator electrode 101 ($V_{DC}$) may remain constant.

Since the potential difference between the resonator electrode 101 and the drive electrode 102 may remain virtually uninfluenced by the variation of the potential of the external electrode 103, the electro-mechanical coupling factor (η) may also remain virtually uninfluenced by the potential variation of the external electrode 103.

Trimming the resonance frequency (f) by varying the potential of an external electrode 103 may have only a very limited adverse effect on the other performance parameters. A trimming in a range of a few tens of parts per million (ppm) may be possible with a very insignificant effect on the other performance parameters and trimming in a larger range may have only a limited effect on these parameters.

When $V_{trim}$ is either greater than $V_{DC}$ or less than $V_{DC}$ an attractive force $F_{ext}$ 110 is generated on the resonator electrode 101 pulling the resonator electrode 101 towards the external electrode 103. The attractive force $F_{ext}$ 110 reduces the effect of the electrical force $F_{el}$ 112, the force between the resonator electrode 101 and the drive electrode 102. The difference in the potentials $V_{trim}$-$V_{DC}$ has therefore an effect on the capacitance $C_e$ 120, between the resonator electrode 101 and the external electrode 103, and the capacitance $C_o$ 122 between the resonator electrode 101 and the drive electrode 102. For example, the attractive force $F_{ext}$ 110 may increase the capacitance $C_e$ 120 and, at the same time, may reduce the capacitance $C_o$ 122.

The MEMS device 100 may be operated by applying an AC voltage signal ($V_{AC}$) at the drive electrode 102 and by sensing it at the resonator electrode 101. When the frequency of the AC voltage signal matches the resonance frequency of the resonator electrode 101 the impedance of the path is reduced and hence a larger signal is sensed at the resonator electrode 101.

In one embodiment, the second order temperature coefficient of the resonance frequency may be compensated by the proposed trimming technique, especially by applying a trimming voltage ($V_{trim}$) via the external electrode 103. In one embodiment, the application of the proposed trimming technique may be combined with the use of an oxide filling technique which is described in a related patent application Ser. No. 12/187,443 "Passive Temperature Compensation of Silicon MEMS Devices" and which is herein incorporated by reference. The oxide filling technique may compensate the first order temperature coefficient of the resonance frequency while the proposed voltage trimming technique may compensate the second order temperature coefficient of the resonance frequency.

The combination of both techniques may reduce the drift resonance frequency in an exemplary temperature range from -10 C. to 95 C. from about 2000 ppm (0.2% drift) to 0.8 ppm (8e-5%) which makes it suitable for GSM applications, for example.

Figure 2:
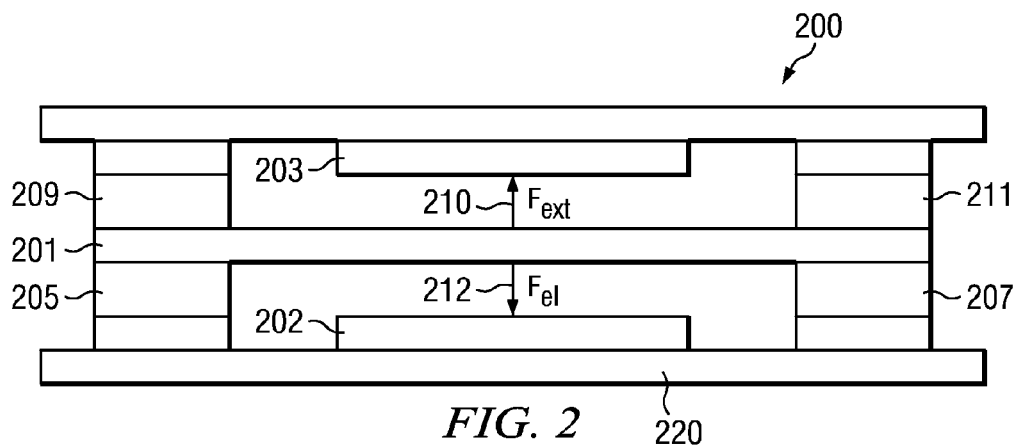
FIG. 2 is another embodiment of a MEMS resonator with two anchor regions.

The trimming voltage ($V_{trim}$) may further depend on a temperature. In one embodiment the dependence on the temperature is quite identical to that of a bandgap voltage reference source of about 1.25 V. Using the bandgap reference voltage as source makes the embodiments of the present inventions desirable for noise sensitive applications such as GSM FIG. 2 shows a cross sectional view of an embodiment of a MEMS devise in form of a plate MEMS resonator device. MEMS resonator device 200 is an example of CC Beam resonator. FIG. 2 shows a CC Beam or first movable plate electrode 201, a second electrode or drive electrode 202 and a third electrode or external electrode 203. The movable plate electrode 201 is fixed via the anchor regions 205, 207 to the substrate 220. The second electrode or drive electrode is 202 is placed atop of the substrate 220 and the third electrode or external electrode 203 is fixed via the anchor regions 205-211 to the substrate 220.

Applying a DC bias voltage ($V_{DC}$) over he first movable plate electrode 201 and the drive electrode 202 attracts the first movable plate electrode 201 toward the drive electrode 202 resulting in an electrostatic force $F_{el}$ 212. The electrostatic force $F_{el}$ 212 moves the first movable plate electrode 201 towards the drive electrode 202 until an equilibrium between the spring force and the electrostatic force $F_{el}$ 212 is reached resulting in a spring constant ($k_{elec}$).

Applying a positive or negative trimming voltage ($V_{trim}$) to the external electrode 203 moves the first movable plate electrode 201 towards the external electrode 203 resulting in an attractive force $F_{ext}$ 210 and therefore in an additional spring constant ($k_{trim}$) reducing the effect of the electrostatic force $F_{el}$ 212

Figure 3:
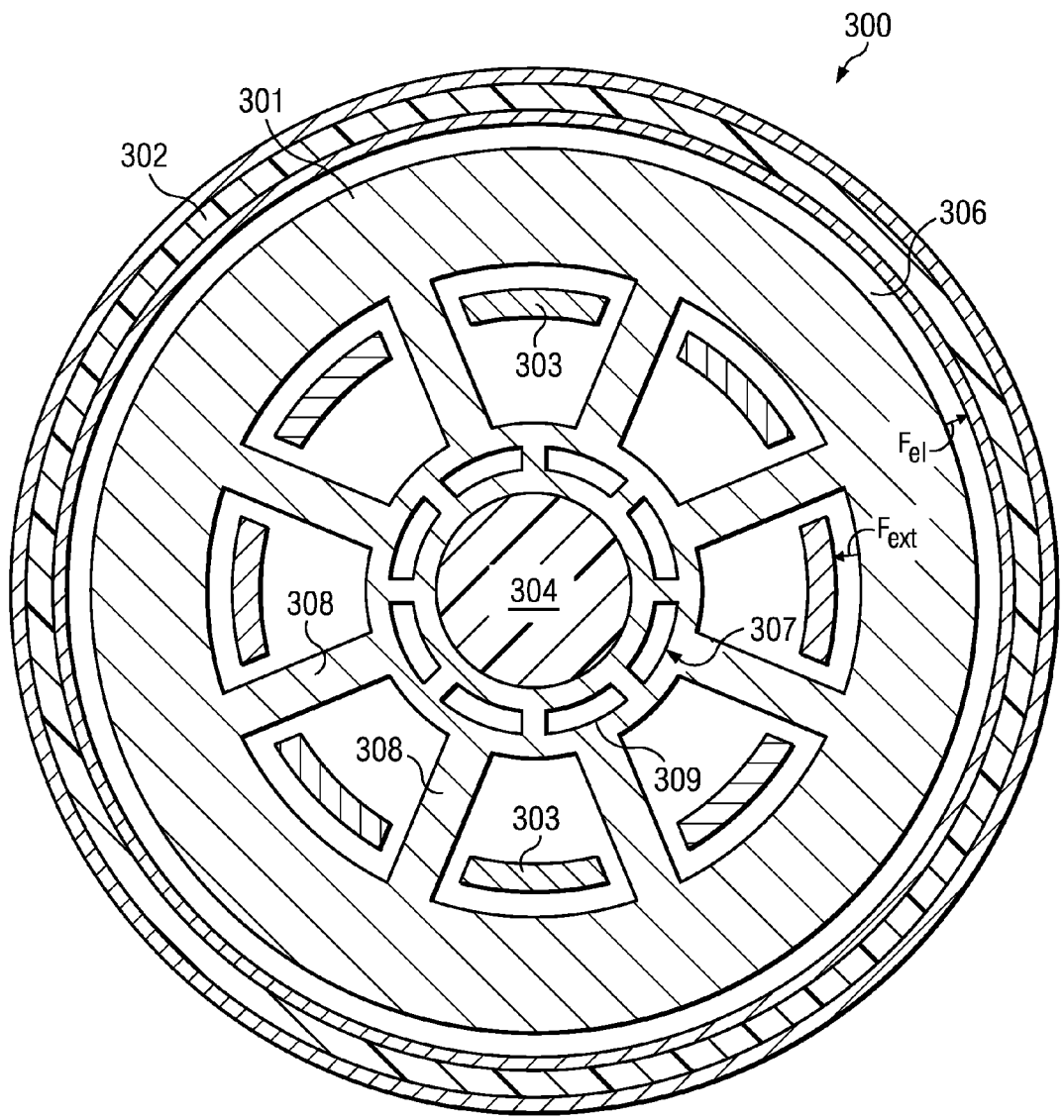
FIG. 3 is a top view of an embodiment of a MEMS resonator.

FIG. 3 shows another embodiment of a MEMS devise in form of a wheel shaped MEMS resonator device. In one embodiment, device 300 comprises a wheel mass 301 which functions as resonator electrode. The wheel mass 301 is spaced apart from the drive electrode 302 by a gap 306. Wheel mass 301 is round in one embodiment, although other shapes and configurations are possible. For example, resonator may have a circumference, a periphery with at least a portion having a radius, or some other shape in embodiments.

Drive electrode 302 and gap 306 extend along a circumference of MEMS resonator device 300. The drive electrode 302 may comprise a single electrode but, alternatively, may comprise a plurality of electrodes. MEMS resonator device 300 also comprises an anchor region 307 coupled to the wheel mass 301 by a plurality of beam elements 308. While resonator device 300 comprises eight beam elements 308, the number, placement and configuration can vary in other embodiments. A plurality of apertures 309 are formed in the anchor region 307 and anchor region 307 is coupled to a substrate by an anchor portion 304. The number, configuration and placement of apertures 309 can vary in other embodiments. MEMS resonator device 300 also comprises one or more external electrodes 303.

Drive electrode 302 provides a large electrode area, and wheel mass 301 is configured to resonate or vibrate in a radial breath, or longitudinal mode capable of a large mechanical spring constant.

External electrodes 303 provide also a large electrode area to tune wheel mass 301 efficiently. The external electrodes 303 can be electrically contacted individually or in any configuration, e.g. grouping the external electrodes 303 into 2, 4 or 8 elements.

Applying a bias voltage ($V_{Bias}$) over the wheel mass 301 and the drive electrode 302 attracts the wheel mass 301 toward the drive electrode 302 resulting in an electrostatic force $F_{el}$. The electrostatic force $F_{el}$ moves the wheel mass 301 towards the drive electrode 302 until a first equilibrium between the spring force and the electrostatic force $F_{el}$ is reached resulting in a spring constant ($k_{elec}$).

Applying a positive trimming voltage ($V_{trim}$) to the one or more external electrodes 303 moves the wheel mass 301 towards the external electrode 303 resulting in an additional spring constant ($k_{trim}$) reducing the effect of the electrostatic force $F_{el}$.

Figure 4:
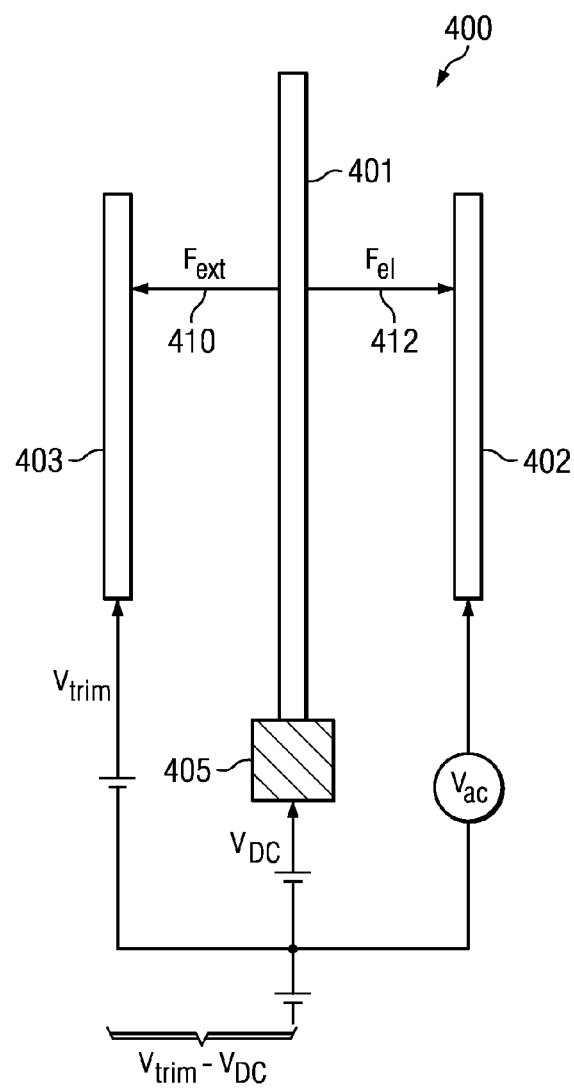
FIG. 4 is an embodiment of a MEMS resonator with one anchor region.

FIG. 4 illustrates a schematic view of a further embodiment of a MEMS resonator device. FIG. 4 shows a MEMS device 400 with only one anchor region, e.g. only one part of the vibrating structure is fixed. The same numerals will be used in this embodiment for the same or similar elements of embodiment in FIG. 1.

The MEMS resonator device 400 includes a vibrating structure or resonator element, typically a resonator electrode 401, a first electrode or drive electrode 402 and a second electrode external electrode 403. In one embodiment, the resonator electrode 401 is anchored to the substrate at the bottom 405 having one free end.

A desired resonance frequency (f) may be set in a similar way as described for the CC Beam arrangement of FIG. 1. In order to set a desired resonance frequency (f) a DC bias voltage ($V_{DC}$) across the resonator electrode 401 and the drive electrode 402 may be set. To further tune the frequency towards the desired resonance frequency (f) an additional trimming voltage ($V_{trim}$) may be applied to the external electrode 403. The DC potential difference between the resonator electrode 401 and the external electrode 403 is $V_{trim}$-$V_{DC}$. By varying only $V_{trim}$ the potential difference between the external electrode 403 and the resonator electrode 401 may vary, whereas the potential difference between the drive electrode 402 and the resonator electrode 401 ($V_{DC}$) may remain constant.

When $V_{trim}$ is either greater than $V_{DC}$ or less than $V_{DC}$ an attractive force $F_{ext}$ 410 is generated on the resonator electrode 401 pulling the resonator electrode 401 towards the external electrode 403. The attractive force $F_{ext}$ 410 reduces the effect of the electrical force $F_{el}$ 412, the force between the resonator electrode 401 and the drive electrode 402. The difference in the potentials $V_{trim}$-$V_{DC}$ has therefore an effect on the capacitance $C_e$ 420, between the resonator electrode 401 and the external electrode 403, and the capacitance $C_o$ 422 between the resonator electrode 401 and the drive electrode 402.

The MEMS device 400 may be operated by applying an AC voltage signal ($V_{AC}$) at the drive electrode 402 and by sensing it at the resonator electrode 401. When the frequency of the AC voltage signal matches the resonance frequency of the resonator electrode 401 the impedance of the path is reduced and hence a larger signal is sensed at the resonator electrode 401.

However, unlike the CC Beam arrangement in FIG. 1, the single anchored MEMS resonator is highly non-linear and generally provides a low resonance frequency, for example.

Although the present invention and its advantages have been described in detail, it should be understood that various changes, substitutions and alterations can be made herein without departing from the spirit and scope of the invention as defined by the appended claims. For example, many of the features and functions discussed above can be implemented in other hardware solutions.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A microelectromechanical system (MEMS) comprising:
   an anchor region;
   an electrode connected to the anchor region comprising an outer circumference, a first plurality of openings and a second plurality of openings;
   a first drive or trim electrode surrounding the outer circumference of the electrode; and
   a plurality of second drive or trim electrodes located in the first plurality of openings of the electrode.

2. The MEMS according to claim 1, wherein the electrode comprises a wheel electrode.

3. The MEMS according to claim 1, wherein the electrode comprises a vibrating MEMS structure.

4. A method for operating a microelectromechanical system (MEMS) comprising an electrode connected to a first anchor region comprising an outer circumference and a plurality of openings, a first drive or trim electrode surrounding the outer circumference of the electrode and a plurality of second drive or trim electrodes located in the plurality of openings of the electrode, the method comprising:
   applying a first bias voltage to the electrode and the first drive or trim electrode; and
   applying a second bias voltage to the second drive or trim electrodes, wherein the second bias voltage is independent from the first bias voltage.

5. The method according to claim 4, wherein applying the first bias voltage shifts a stiffness of the electrode from a first stiffness to a second stiffness.

6. The method according to claim 5, wherein applying the second bias voltage shifts the second stiffness to a third stiffness.

7. The method according to claim 4, wherein the electrode comprises a vibrating MEMS structure.

8. The method according to claim 4, wherein the electrode comprises a wheel electrode.

9. A method for operating a microelectromechanical system (MEMS) comprising a first anchor region, a second anchor region, a plate electrode connected to the first anchor region and the second anchor region, a first electrode located adjacent a first surface of the plate electrode and laterally disposed between the first anchor region and the second anchor region, and a second electrode located adjacent a second surface of the plate electrode and connected to the first anchor region and the second anchor region, the method comprising:
   applying a first bias voltage to the plate electrode of the MEMS and the first electrode; and
   applying a second bias voltage to the second electrode, wherein the second bias voltage is independent from the first bias voltage,
   wherein applying the first bias voltage shifts a stiffness of the plate electrode from a first stiffness to a second stiffness, and
   wherein applying the second bias voltage shifts the stiffness from the second stiffness to a third stiffness.

10. The method according to claim 9, wherein the first electrode comprises a plurality of first electrodes.

11. The method according to claim 9, wherein the second electrode comprises a plurality of second electrodes.

12. The method according to claim 9, wherein the plate electrode comprises a vibrating MEMS structure.

13. The method according to claim 9, wherein the plate electrode comprises a membrane.

14. A microelectromechanical system (MEMS) comprising:
   a first anchor region;
   a second anchor region;
   a plate electrode connected to the first anchor region and the second anchor region, wherein the plate electrode is a semiconductive plate electrode;
   a first electrode located adjacent to and spaced apart from a first surface of the plate electrode and laterally disposed between the first anchor region and the second anchor region, wherein the first electrode comprises a plurality of first electrodes; and
   a second electrode located adjacent to and spaced apart from a second surface of the plate electrode and connected to the first anchor region and the second anchor region.

15. The MEMS according to claim 14, wherein the second electrode comprises a plurality of second electrodes.

16. The MEMS according to claim 14, wherein the plate electrode comprises a clamped-clamped beam resonator.

17. The MEMS according to claim 14, wherein the plate electrode comprises a vibrating MEMS structure.

18. The MEMS according to claim 14, wherein the plate electrode comprises a membrane.

19. The MEMS according to claim 14, wherein the second electrode is a single electrode.

* * * * *